United States Patent
Heim et al.

(10) Patent No.: US 7,019,950 B2
(45) Date of Patent: Mar. 28, 2006

(54) MAGNETORESISTIVE SENSOR HAVING BIAS MAGNETS WITH STEEP ENDWALLS

(75) Inventors: David Eugene Heim, Redwood City, CA (US); Mustafa Michael Pinarbasi, Morgan Hill, CA (US)

(73) Assignee: Hitachi Global Storage Technologies, Netherlands, B.V., Amsterdam (NL)

( * ) Notice: Subject to any disclaimer, the term of this patent is extended or adjusted under 35 U.S.C. 154(b) by 189 days.

(21) Appl. No.: 10/464,254

(22) Filed: Jun. 17, 2003

(65) Prior Publication Data

US 2004/0257716 A1 Dec. 23, 2004

(51) Int. Cl.
*G11B 5/39* (2006.01)

(52) U.S. Cl. .................................. 360/324.12
(58) Field of Classification Search ........... 360/317, 360/324.1, 324.11, 324.12, 324.2
See application file for complete search history.

(56) References Cited

U.S. PATENT DOCUMENTS

| | | | |
|---|---|---|---|
| 5,949,623 A * | 9/1999 | Lin | 360/324.12 |
| 6,219,208 B1 | 4/2001 | Gill | 360/324.1 |
| 6,219,210 B1 | 4/2001 | Pinarbasi | 360/324.11 |
| 6,262,869 B1 | 7/2001 | Lin et al. | 360/324.11 |
| 6,317,300 B1 * | 11/2001 | Sasaki et al. | 360/325 |
| 6,396,671 B1 | 5/2002 | Horng et al. | 360/324.1 |
| 6,396,734 B1 | 5/2002 | Ishikawa et al. | 365/158 |
| 6,404,191 B1 | 6/2002 | Daughton et al. | 324/252 |
| 6,421,212 B1 * | 7/2002 | Gibbons et al. | 360/327.31 |
| 6,449,134 B1 | 9/2002 | Beach et al. | 360/324.12 |
| 6,515,838 B1 * | 2/2003 | Gill | 360/324.12 |
| 6,570,745 B1 * | 5/2003 | Gill | 360/324.12 |
| 6,608,740 B1 * | 8/2003 | Tanaka et al. | 360/324.12 |
| 6,687,098 B1 * | 2/2004 | Huai | 360/324.12 |
| 6,747,853 B1 * | 6/2004 | Hayashi et al. | 360/324.12 |
| 2002/0012209 A1 * | 1/2002 | Ajiki et al. | 360/327.3 |
| 2002/0135953 A1 | 9/2002 | Gill | 360/324.12 |
| 2002/0135954 A1 | 9/2002 | Yoshikawa et al. | 360/324.12 |

* cited by examiner

Primary Examiner—Jefferson Evans
(74) Attorney, Agent, or Firm—Zilka-Kotab, PC

(57) ABSTRACT

A magnetoresistive sensor has bias magnets with substantially vertical end walls. The offset between the bias magnets and the free layer is optimized by adjusting the thickness of a spacer layer. A disk drive has a read element including a magnetoresistive sensor with optimized bias magnets having substantially vertical end walls.

14 Claims, 8 Drawing Sheets

MAGNETORESISTIVE SENSOR HAVING BIAS MAGNETS WITH STEEP ENDWALLS

BACKGROUND OF THE INVENTION

1. Field of the Invention

The invention relates to a magnetoresistive sensor, typically used in a magnetic disk drive; and, more specifically, the invention relates to a magnetoresistive sensor having bias magnets with substantially vertical endwalls.

2. Description of the Background Art

Disk drives using magnetic recording of digital information store most of the data in contemporary computer systems. A disk drive has at least one rotating disk with discrete concentric tracks of data. Each disk drive also has at least one recording head typically having a separate write element and read element for writing and reading the data on the tracks.

The read element in most contemporary disk drives includes a magnetoresistive spin valve sensor. A magnetic spin valve sensor includes a sandwich of layers, also known as a sensor stack, including a ferromagnetic pinned layer, a nonmagnetic electrically conducting layer, and a ferromagnetic free layer. The sensor stack is disposed between two magnetic shields. The distance between the two magnetic shields determines the read gap. The size of the read gap strongly influences the capability of the sensor to accommodate high recorded density. The resistance of the spin valve sensor changes with respect to the direction and magnitude of an applied magnetic field such as the field from a written magnetic transition on a disk. To detect the change in resistance, sense current is passed through the sensor through electrical leads. The electrical leads are also known as lead layers, or more simply, leads. Typically, hard bias material is disposed in layers near the ends of a sensor stack forming permanent magnets which impose a stabilizing magnetic biasing field on the sensor stack. The permanent magnets are also known as hard bias magnets or bias magnets.

The disposition and placement of the bias magnets is important for the performance of the spin valve sensor. In a typical prior art spin valve, the sensor stack is formed using a photoresist liftoff structure which leaves rounded or sloped ends to the sensor stack. The hard bias material is then deposited over these sloped ends forming abutted junctions. Each abutted junction has a significant width resulting in a relatively broad distribution of the magnetic pole at each abutted junction. As the required trackwidths of spin valve sensors become more and more narrow, the width of the abutted junction becomes a much greater fraction of the total trackwidth. In addition, the abutted slopped junction is somewhat inefficient requiring a rather thick layer of hard bias material to fully stabilize the sensor. The deleterious effects associated with abutted junctions are becoming more troublesome as the required trackwidths become smaller.

Accordingly, what is needed is a magnetic spin valve sensor in which the hard bias material forms a narrow and more effective junction with the sensor stack.

SUMMARY OF THE INVENTION

In a preferred embodiment, a magnetoresistive spin valve sensor is provided having a sensor stack which is magnetically stabilized with two bias magnets. The bias magnets have substantially vertical endwalls. The steep vertical endwalls of the bias magnets provide a very narrow junction with the sensor stack. In addition, a non-magnetic spacer layer is used to optimize the position of the bias magnets relative to the free layer. The novel magnetoresistive sensor has improved spatial resolution. In addition, the junction between the sensor stack and the bias magnets with substantially vertical endwalls is efficient. This efficiency allows a thinner bias magnet to be used which results in less sensitivity loss.

In another embodiment, a disk drive is provided wherein the read element includes a magnetoresistive spin valve sensor which is magnetically stabilized with two bias magnets having substantially vertical endwalls.

Other aspects and advantages of the present invention will become apparent from the following detailed description, which, when taken in conjunction with the drawings, illustrate by way of example the principles of the invention.

BRIEF DESCRIPTION OF THE DRAWINGS

FIG. 3a illustrates a view of the layers of a sensor stack as deposited on a substrate;

FIG. 3b illustrates a view of the formation of a photoresist liftoff structure on the layers of a sensor stack;

FIG. 3c illustrates a view of the formation of bias magnets after ion milling;

FIG. 3d illustrates a view of the sensor after formation of leads;

FIG. 3e illustrates a view of the sensor after liftoff of the photoresist;

FIG. 4a illustrates a view of layers of a sensor stack as deposited on a substrate;

FIG. 4b illustrates a view of patterned photoresist formed over the layers of a sensor stack;

FIG. 4c illustrates a view of the results of ion milling;

FIG. 4d illustrates a view of the sensor after formation of nonmagnetic spacer material;

FIG. 4e illustrates a view of the sensor after formation of hard bias material;

FIG. 4f illustrates a view of the sensor after formation of leads;

FIG. 4g illustrates a view of the sensor after removal of the patterned photoresist;

FIG. 4h illustrates a view of an alternate embodiment of the invention having lead overlays with substantially vertical endwalls; and, FIG. 5 illustrates an example of a plot of available bias field magnitude as a function of offset and separation.

DETAILED DESCRIPTION OF THE INVENTION

As shown in the figures for purposes of illustration and described in detail in this section, the invention is embodied in a novel magnetoresistive spin valve sensor having bias magnets with substantially vertical endwalls. A nonmagnetic spacer layer is used to optimize the offset between the bias magnets and the free layer. The invention may also be embodied in a disk drive having a read element including a magnetic spin valve sensor including bias magnets with substantially vertical endwalls. Excellent sensor stability is obtained without sacrificing sensitivity.

Figure 1:
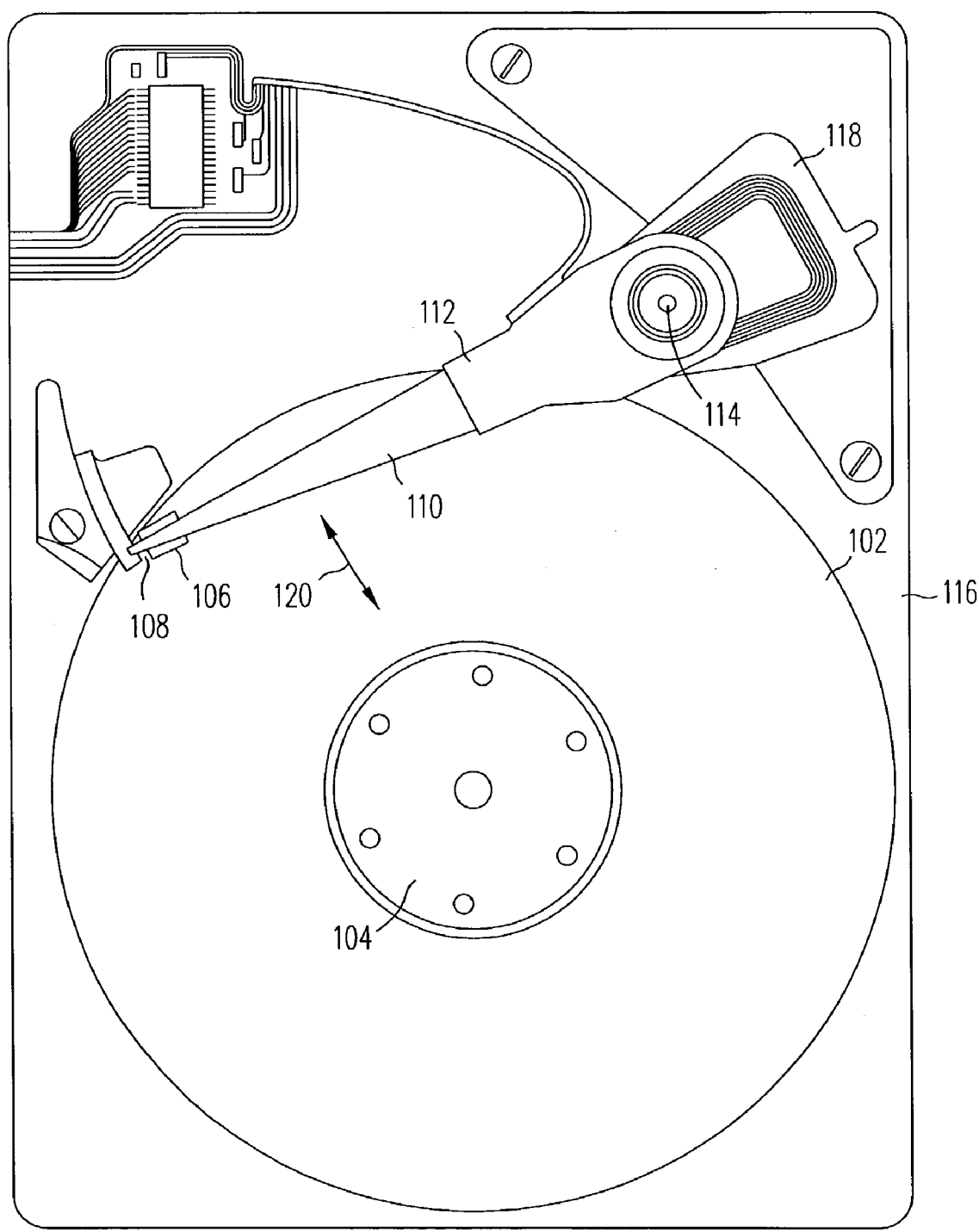
FIG. 1 illustrates a view of a disk drive having a magnetoresistive sensor according to the present invention.

Referring to FIG. 1, a magnetic disk drive 100 has at least one rotatable magnetic disk 102 supported by a spindle 104 and rotated by a motor (not shown). There is at least one slider 106 with an attached recording head 108 positioned over the disk 102 surface while reading and writing. The recording head 108 includes a write element for writing data onto the disk 102. The recording head also includes a magnetoresistive spin valve sensor according to the present invention (shown in detail below) used as a read element for reading data from the disk. The slider 106 is attached to a suspension 110 and the suspension 110 is attached to an actuator 112. The actuator 112 is pivotally attached 114 to the housing 116 of the disk drive 100 and is rotated about a pivot point by a voice coil motor 118. As the disk is rotating, the actuator 112 positions the slider 106 and suspension 110 along a radial arcuate path 120 over the disk 102 surface to access the data track of interest.

Again referring to FIG. 1, during operation of the disk drive 100, the motion of the rotating disk 102 relative to the slider 106 generates an air bearing between the slider 106 and the disk 102 surface which exerts an upward force on the slider 106. This upward force is balanced by a spring force from the suspension 110 urging the slider 106 toward the surface of the disk 102. Alternatively, the slider 106 may be in either partial or continuous contact with the disk 102 surface during operation.

Figure 2:
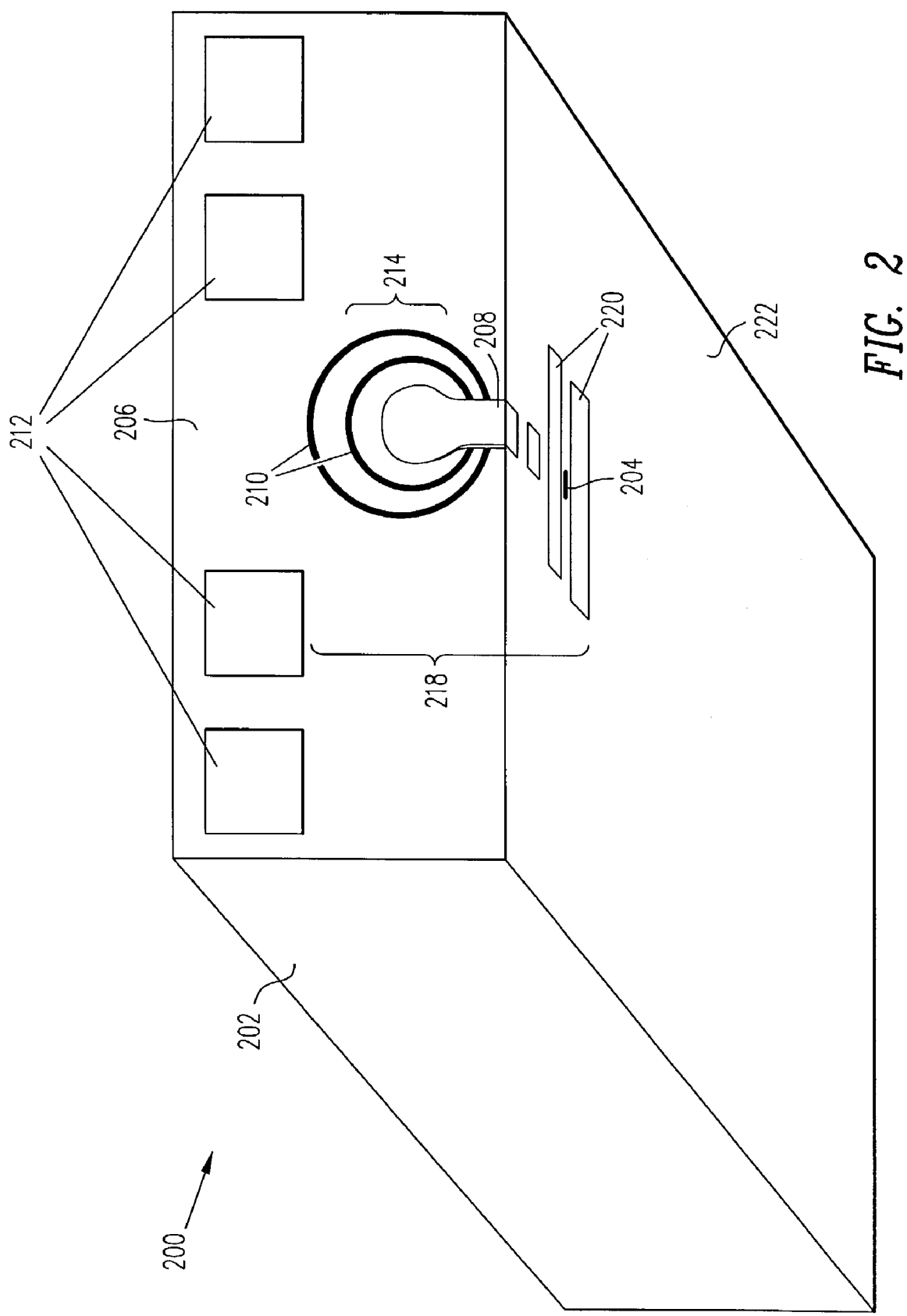
FIG. 2 illustrates a view (not necessarily to scale) of a slider and recording head having a magnetoresistive sensor according to the present invention.

FIG. 2 illustrates a more detailed view of a slider 200. The recording head 218 is preferably constructed on the trailing surface 206 of the slider 200. FIG. 2 illustrates the upper pole 208 and the turns 210 of the coil 214 of the write element of the recording head 218. The read element, including a read sensor 204 disposed between two magnetic shields 220, is formed between the slider body 202 and the write element. The electrical connection pads 212 which allow connection with the write element and read element are illustrated. The disk facing portion 222 of the slider 200 typically has an air bearing (not shown). The disk facing view of the recording head 218 is the view on the disk facing portion 222 of the slider 200.

Figure 3A:
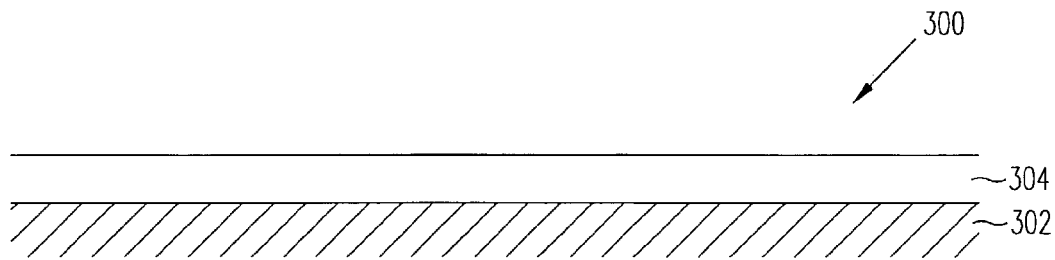
FIGS. 3a–e illustrate disk facing views of a magnetoresistive sensor according to the prior art during several manufacturing steps.
Figure 3B:
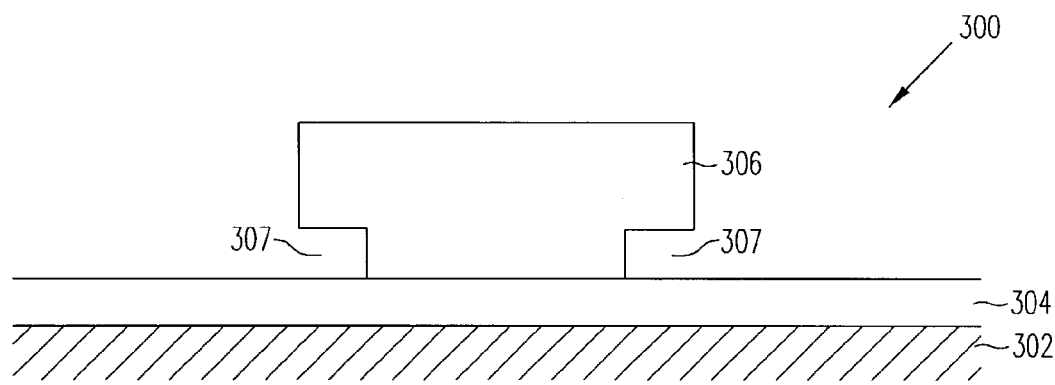
Figure 3C:
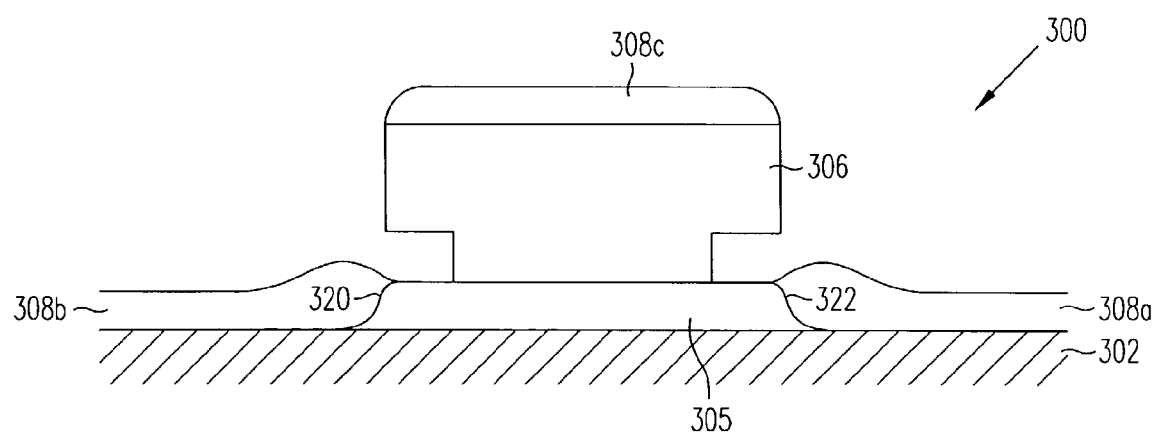

FIGS. 3a–f illustrate disk facing views of a magnetoresistive head 300 according to the prior art during several stages of manufacture. FIG. 3a illustrates a view of the layers 304 of the sensor stack as deposited on a suitable substrate 302 such as alumina. FIG. 3b illustrates a cross sectional view of a photoresist liftoff structure 306 formed over the layers 304 of the sensor stack. The photoresist liftoff structure 306 has overhang features 307 which promote liftoff or removal of the photoresist material after formation of subsequent layers (shown below). FIG. 3c illustrates the sensor 300 after ion milling was used to form the sensor stack 305. FIG. 3c also illustrates the deposited hard bias material 308a, 308b, 308c. The hard bias material adjacent to the ends 320, 322 of the sensor stack 305 forms permanent bias magnets 308a, 308b. The magnetic field from the bias magnets 308a, 308b stabilizes the sensor stack 305. The hard bias material is typically an alloy such as CoPtCr or the like. Typically, the material used to form bias magnets is physically harder than a shield material such as permalloy.

Figure 3D:
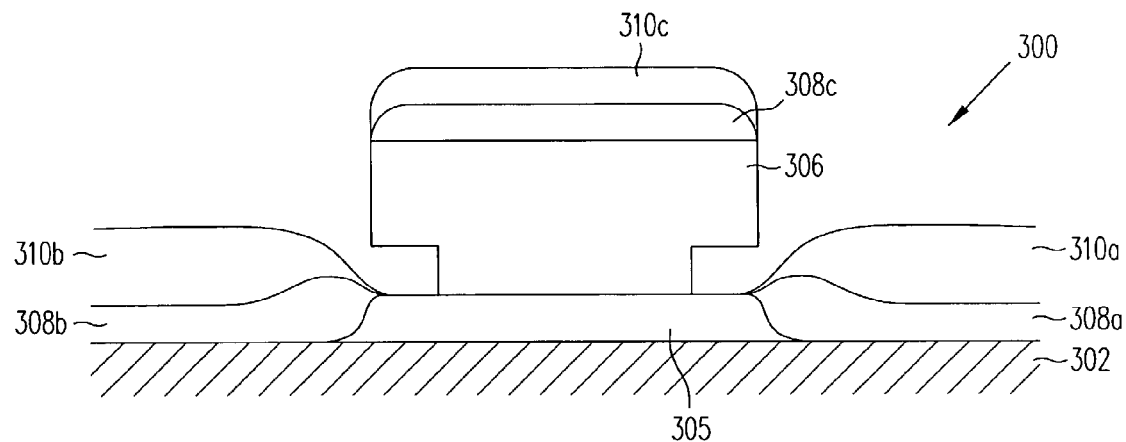
Figure 3E:
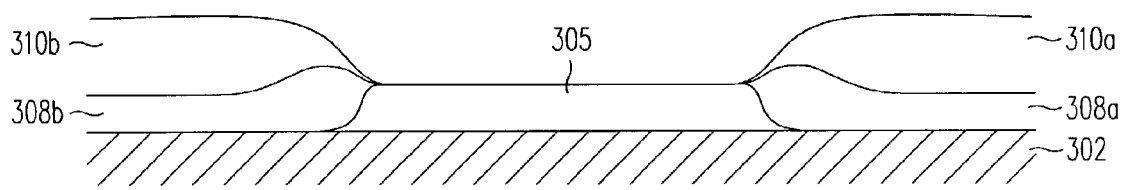
Figure 3F:
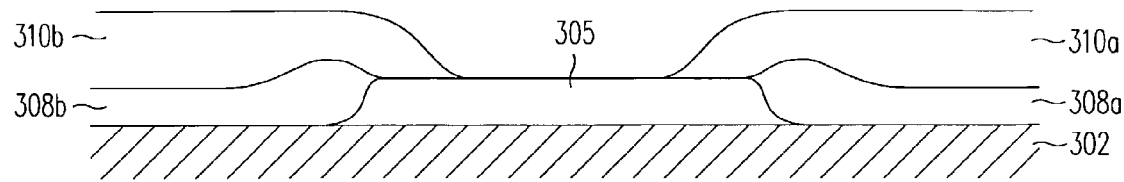
FIG. 3f illustrates a view of an alternative sensor with conventional lead overlays.

FIG. 3d illustrates the formation of electrical leads 310a, 310b. The material used to form the electrical leads 310a, 310b is also deposited 310c over the photoresist liftoff structure 306. FIG. 3e illustrates the sensor 300 after liftoff or removal of the photoresist liftoff structure 306. In an alternate embodiment of the prior art, the leads 310a, 310b are formed over a portion of the sensor stack 305 as illustrated in FIG. 3f.

Figure 4A:
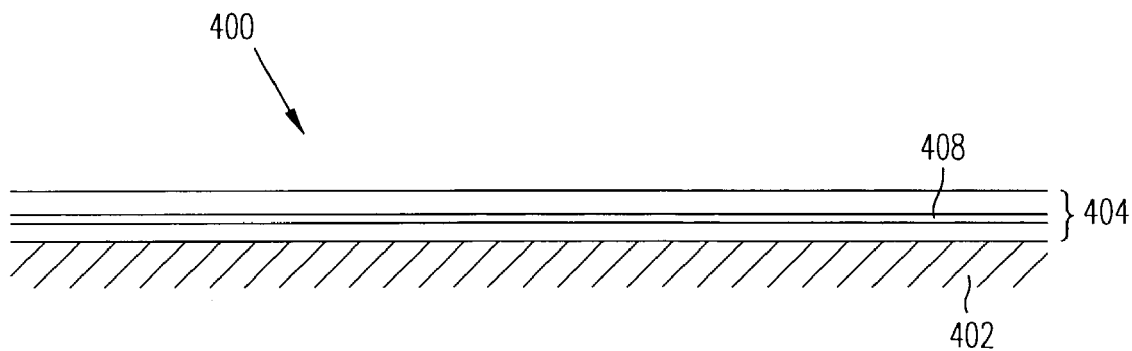
FIGS. 4a–h illustrates disk facing views of a magnetoresistive sensor (not necessarily to scale) according to the present invention during several manufacturing steps.
Figure 4B:
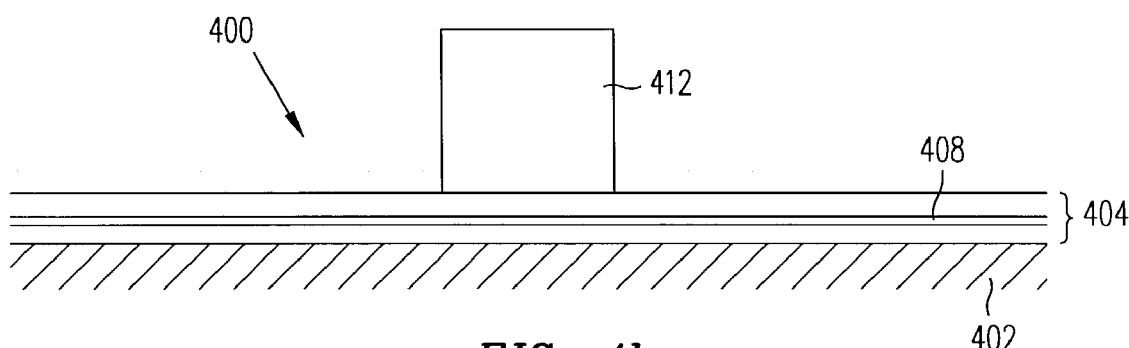
Figure 4C:
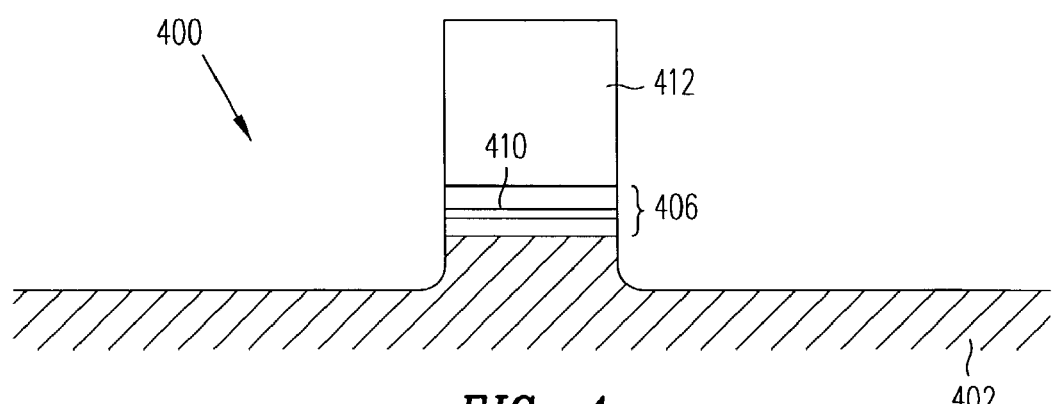

FIGS. 4a–g illustrate disk facing views of a magnetoresistive sensor 400 according to the present invention during several stages of manufacture. The illustrations in FIGS. 4a–g are representative only and are not necessarily to scale; those skilled in the art may recognize other steps resulting in the invented sensor. FIG. 4a illustrates a view of the sensor stack comprising a sandwich of layers 404 on a suitable substrate 402 such as alumina. The sandwich of layers 404 includes a free layer 408 and additional layers such as a pinned layer and a capping layer (not separately shown). FIG. 4b illustrates a view of a patterned layer 412 of photoresist formed over the sandwich of layers 404. The patterned layer 412 of photoresist does not have the known liftoff structure previously illustrated for the prior art (306 in FIG. 3b), but instead has substantially vertical walls. FIG. 4c illustrates a view of the results of performing a ion milling operation. The sensor stack 406 and the free layer 408 are the portions of the sandwich of layers 404 remaining after ion milling. The ion milling operation is aggressive enough to remove portions of the underlying substrate 402.

Figure 4D:
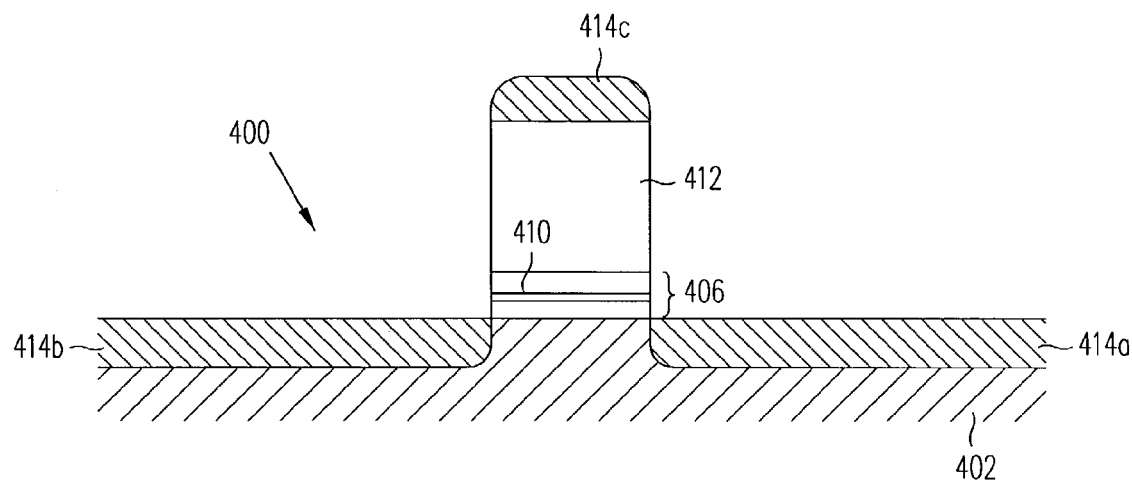

FIG. 4d illustrates a view of the deposited nonmagnetic spacer material 414a, 414b, 414c. The nonmagnetic spacer material 414a, 414b, 414c may be conveniently formed from a suitable material such as chromium. Some materials used for the nonmagnetic spacer material 414a, 414b, 414c may necessitate the formation of a thin seed layer (not shown) of a suitable metal such as chromium onto the spacer material 414a, 414b, 414c before formation of the bias magnets (discussed in detail below). Two of the portions 414a, 414b form a nonmagnetic spacer layer on each side of the sensor stack 406. The other portion 414c is formed on the patterned photoresist 412 and is subsequently removed along with the photoresist 412.

During the formation of the nonmagnetic spacer layer a small amount of nonmagnetic spacer material is also formed on the endwalls of the sensor stack. This is shown in detail below in the insert 420 of FIG. 4g. The deposited nonmagnetic spacer material 438 contributes to a separation 422 between the bias magnet 416b and the free layer 410.

Figure 4E:
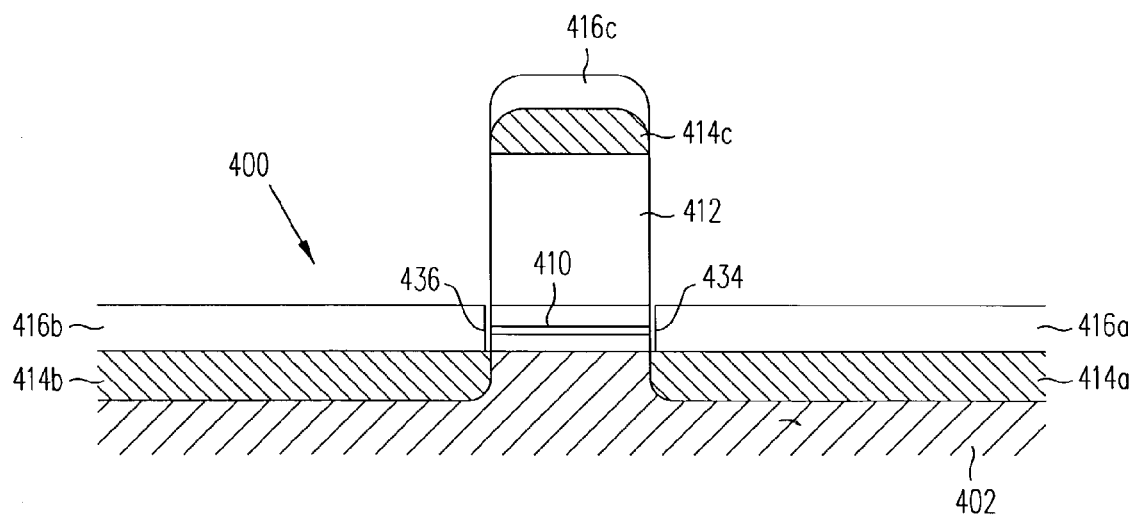
Figure 4F:
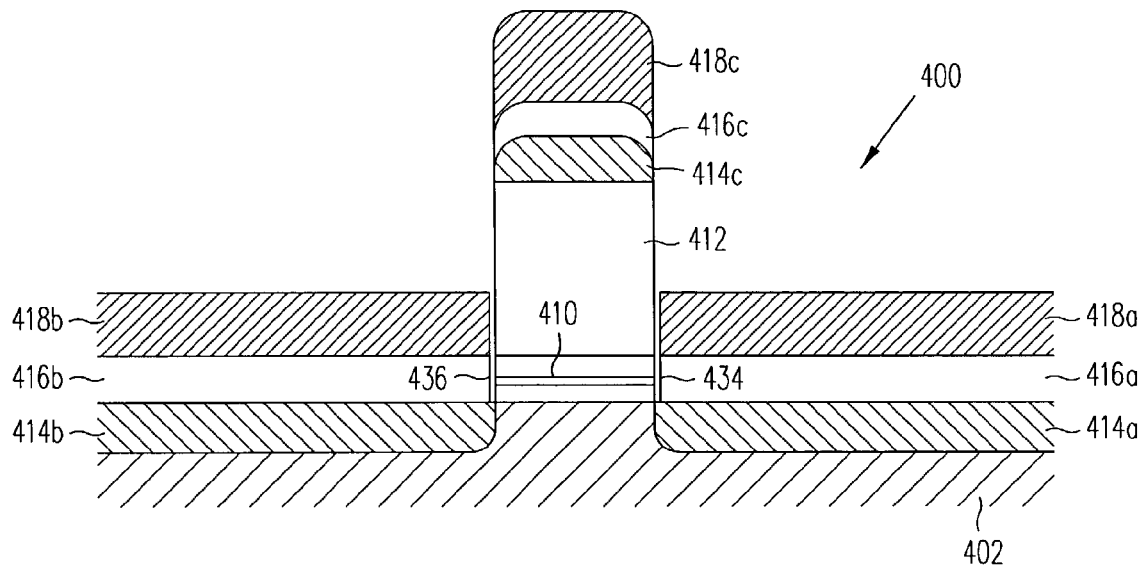

FIG. 4e illustrates a view of hard bias material 416a, 416b, 416c formed over the nonmagnetic spacer material 414a, 414b, 414c. The portions 416a, 416b of the hard bias material formed near the sensor stack 406 form permanent bias magnets which will provide a stabilization field. The endwalls 434, 436 of the hard bias magnets 416a, 416b are substantially vertical. FIG. 4f illustrates a view of formed lead material 418a, 418b, 418c onto the sensor 400.

Figure 4G:
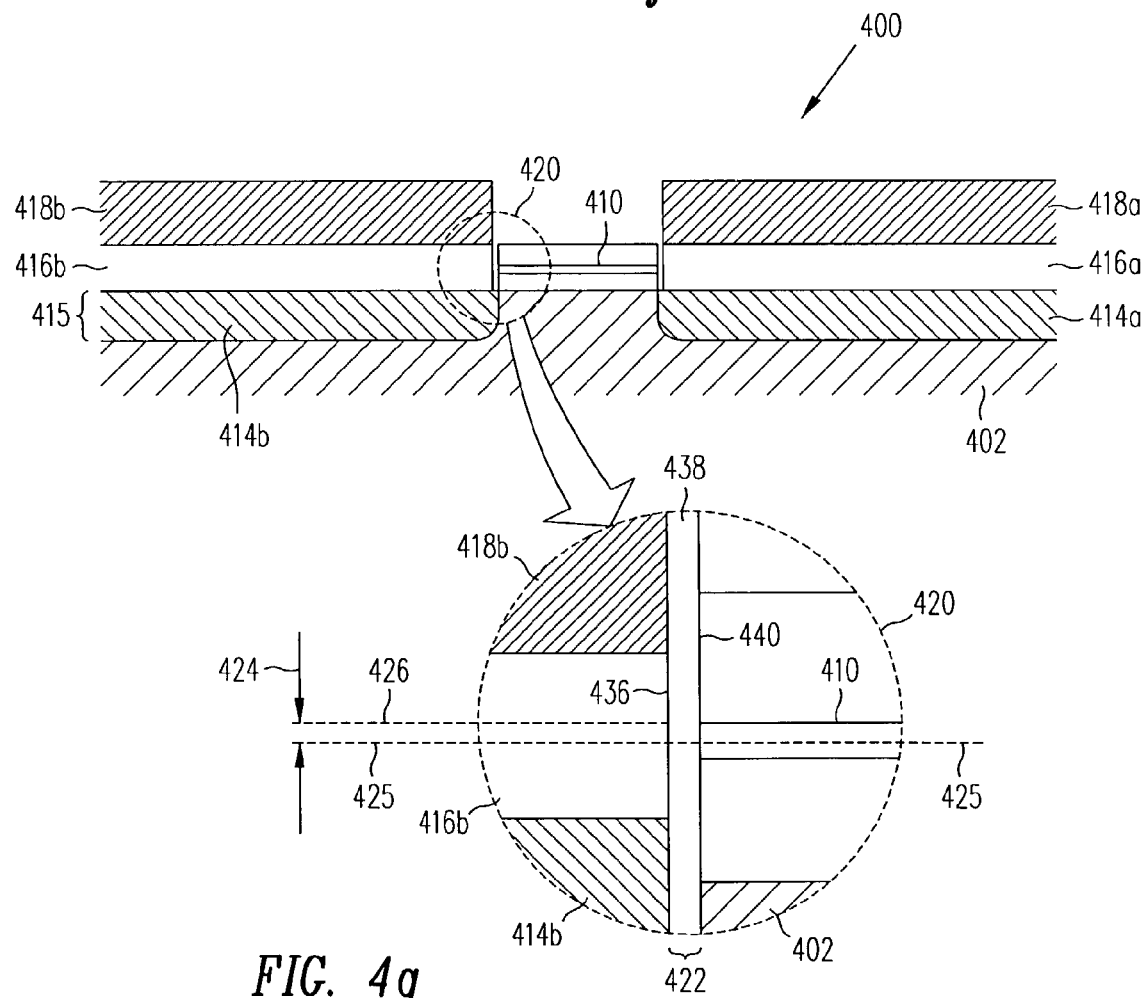

FIG. 4g illustrates a view of the sensor after removal of the patterned layer 412 of photoresist. The preferred method of removing the patterned layer 412 of photoresist is a chemical-mechanical polish procedure, known in the art. This method includes the use of an suitable photoresist solvent along with a mild scrubbing action to remove patterned photoresist layer which do not have a traditional liftoff structure.

The bias magnets provided in the embodiment and illustrated in FIG. 4g have substantially vertical endwalls. These substantially vertical endwalls have a distinct advantage over the sloped endwalls provided by the prior art. The distributed magnetic poles at the endwalls of the hard bias magnets are more spatially concentrated for vertical endwalls compared with sloping endwalls. Thus, permanent bias magnets having vertical endwalls are more efficient in providing a stabilization field for the sensor stack. Accordingly, the thickness of the layer of hard bias material may be reduced resulting in a smaller read gap commensurate with a higher recorded density of stored information.

The effectiveness of the hard bias material is improved if the endwalls are substantially vertical. The effectiveness of the bias magnets is also improved if the hard bias magnets are optimally positioned relative to the free layer in the sensor stack. Two important dimensions for optimally positioning the permanent magnets relative to the free layer are illustrated in the insert 420 in FIG. 4g. The first dimension is the vertical offset 424 between the geometrical center, represented in FIG. 4g by a center line 425, of the free layer 410 relative to the geometrical center, represented by a center line 426, of one of the bias magnets 416b. In principle, the offset 424 between each of the bias magnets 416a, 416b relative to the free layer 410 should be optimized. For simplicity, the position of only one of the bias magnets 416b will be described in detail below. The vertical offset 424 between the geometrical center, represented by center line 425, of the free layer 410 and the geometrical center, represented by center line 426, of one of the bias magnets 416b is controlled by adjusting the thickness 415 of the non-magnetic spacer layer 414b. The second dimension which influences the effectiveness of a permanent magnet is the physical separation 422 between the bias magnet 416b and the free layer 410. The separation 422 is typically rather small, usually about 3 to 8 nanometers. The separation 422 is related to the thickness 415 of the non-magnetic spacer layer 414b. Some non-magnetic spacer material 438 forms on the endwalls 440 of the exposed sensor stack 406 during deposition of the non-magnetic spacer layer 414b. The amount of this non-magnetic spacer layer material 438 depends to a large extent on the thickness 415 of the non-magnetic spacer layer 414b. The amount of non-spacer layer material 438 largely determines the separation 422 between the bias magnet 416b and the free layer 410 in the finished sensor 400. Any seed layer (not shown and usually very thin) deposited on the nonmagnetic spacer layer 414b also contributes to the separation.

Figure 4H:
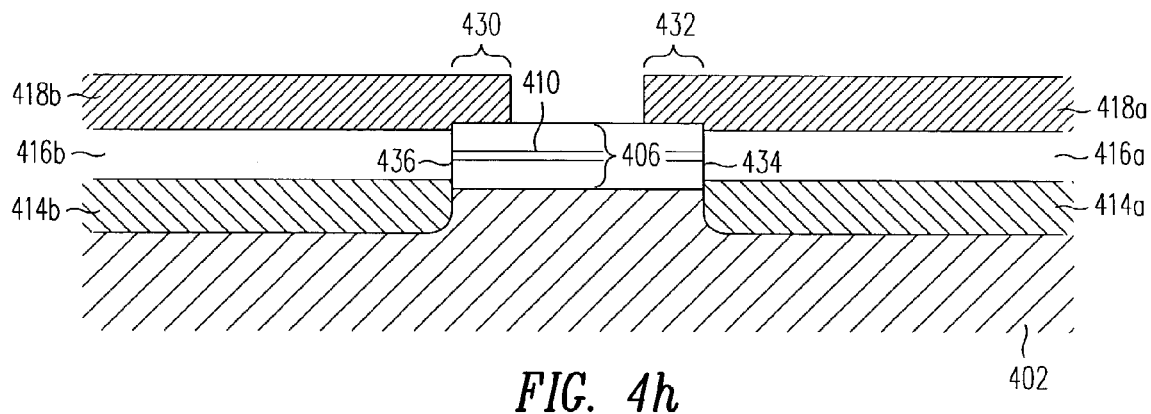

FIG. 4h illustrates a view of an alternative embodiment wherein portions 430, 432 of the leads 418a, 418b are formed over the sensor stack 406. This lead overlay structure also has optimized (described in detail below) bias magnets 416a, 416b with substantially vertical endwalls 434, 436.

Figure 5:
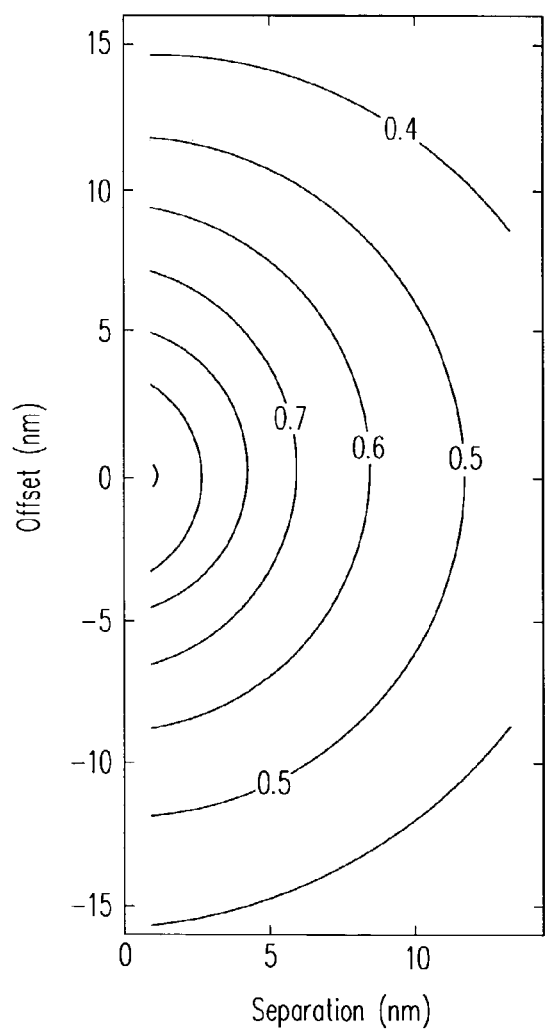

FIG. 5 illustrates a plot of the calculated magnitude of the stabilization field available to the free layer from one of the permanent magnets. The data in FIG. 5 was calculated for a bias magnet which had a magnetic moment four times greater than the magnetic moment of the free layer. Results from bias magnets with different magnetic moments are easily obtained by scaling the data in FIG. 5. The magnitudes in FIG. 5 have been normalized to the maximum field attained with no offset and no separation. In general, a quantitative criterion of optimal positioning of the permanent magnet relative to the free layer is when the combination of separation and the absolute magnitude of offset result in a stabilization field which has a magnitude at least as large as a predetermined value compared with the maximum possible field. For example, if a predetermined value of the field is chosen to be at least 60% of the maximum possible, then a separation of about 8 nm and no offset or a separation of about 2 nm and a magnitude of offset of about 8 nm would be successful combinations. A common preselected value of the acceptable value of the bias field is at least 50% of the maximum value. A more rigorous value of 60% or higher may also be preselected. A more simple process control criterion is to set separate limits on offset and separation. For example, if a preset value of the magnitude of the stabilization field is chosen to be at least 70% of the maximum, then the separation should be less than about 5 nm and the magnitude of offset should be less than about 7 nm.

Embodiments of the present invention provide a magnetoresistive sensor having bias magnets which have substantially vertical endwalls. In addition, the bias magnets are optimally positioned relative to the free layer in the sensor stack. Compared with the sensors provided by the prior art, sensors provided by the present invention have very efficient bias magnets used to provide a stabilization field for the free layer. Because of the higher efficiency, the thickness of the permanent magnets may be reduced resulting in a sensor capable of supporting higher linear recorded density along the direction of the recorded track. Also, the more localized magnetic poles at the end of the permanent magnets result in improved cross track resolution.

Although specific embodiments of the invention has been described and illustrated, one skilled in the art will recognize other embodiments, not expressly described, but which fall within the scope of the invention.

We claim:

1. A magnetoresistive sensor, comprising:
   a sensor stack including a ferromagnetic pinned layer and a ferromagnetic free layer, said sensor stack having a first and second end;
   a first bias magnet disposed at said first end of said sensor stack, said first bias magnet having a substantially vertical end wall; and,
   a second bias magnet disposed at said second end of said sensor stack, said second bias magnet having a substantially vertical end wall;
   wherein the free layer includes a geometrical center, each bias magnet includes a geometrical center, wherein the geometrical centers of the bias magnets are offset from the geometrical center of the free layer,
   wherein a separation between the free layer and each bias magnet is less than about 5 nanometers.

2. A magnetoresistive sensor as in claim 1 further comprising leads that overlap the sensor stack.

3. A magnetoresistive sensor as in claim 1 further comprising leads that do not overlap the sensor stack.

4. A magnetoresistive sensor as in claim 1 wherein the bias magnets are physically spaced apart from the free layer.

5. A magnetoresistive sensor as in claim 1 wherein the offset between the geometrical center of the free layer and the geometrical center of each bias magnet is less than about 8 nanometers.

6. A magnetoresistive sensor, comprising:
   a sensor stack including a ferromagnetic free layer, said ferromagnetic free layer having a first and second end;
   a nonmagnetic spacer layer disposed at said first end of said sensor stack, said nonmagnetic spacer layer having a thickness;
   a bias magnet disposed over said nonmagnetic spacer layer at said first end of said ferromagnetic free layer, wherein said bias magnet includes a substantially vertical end wall and provides a magnetic stabilization field affecting said free layer, said magnetic stabilization field having a magnitude;
   wherein the separation between the free layer and the bias magnet is less than about 5 nanometers.

7. A magnetoresistive sensor as in claim 6 wherein the preselected range of values of the magnetic stabilization field is at least 50% of a value obtained in an otherwise identical sensor with no offset between the geometrical center of the bias magnet and the geometrical center of the free layer and no separation between the free layer and the bias magnet.

8. A magnetoresistive sensor as in claim 6 further comprising leads that overlap the sensor stack.

9. A magnetoresistive sensor as in claim 6 further comprising leads that do not overlap the sensor stack.

10. A magnetoresistive sensor comprising:
a sensor stack including a ferromagnetic free layer, said ferromagnetic free layer having a first and second end;
a nonmagnetic spacer layer disposed at said first end of said sensor stack, said nonmagnetic spacer layer having a thickness;
a bias magnet disposed over said nonmagnetic spacer layer at said first end of said ferromagnetic free layer, wherein said bias magnet includes a substantially vertical end wall and provides a magnetic stabilization field affecting said free layer, said magnetic stabilization field having a magnitude;
wherein said thickness of said nonmagnetic spacer layer is adjusted such that said magnitude of said magnetic stabilization field is within a preselected range of values;
wherein the nonmagnetic spacer layer comprises chromium,
wherein the separation between the free layer and the bias magnet is less than about 5 nanometers.

11. A magnetoresistive sensor comprising:
a sensor stack including a ferromagnetic free layer, said ferromagnetic free layer having a first and second end;
a nonmagnetic spacer layer disposed at said first end of said sensor stack, said nonmagnetic spacer layer having a thickness;
a bias magnet disposed over said nonmagnetic spacer layer at said first end of said ferromagnetic free layer, wherein said bias magnet includes a substantially vertical end wall and provides a magnetic stabilization field affecting said free layer, said magnetic stabilization field having a magnitude;
wherein said thickness of said nonmagnetic spacer layer is adjusted such that said magnitude of said magnetic stabilization field is within a preselected range of values;
wherein the free layer includes a geometrical center, the bias magnet includes a geometrical center, and an offset between the geometrical center of the free layer and the geometrical center of the bias magnet is less than about 8 nanometers.

12. A magnetoresistive sensor comprising:
a sensor stack including a ferromagnetic free layer, said ferromagnetic free layer having a first and second end;
a nonmagnetic spacer layer disposed at said first end of said sensor stack, said nonmagnetic spacer layer having a thickness;
a bias magnet disposed over said nonmagnetic spacer layer at said first end of said ferromagnetic free layer, wherein said bias magnet includes a substantially vertical end wall and provides a magnetic stabilization field affecting said free layer, said magnetic stabilization field having a magnitude;
wherein said thickness of said nonmagnetic spacer layer is adjusted such that said magnitude of said magnetic stabilization field is within a preselected range of values;
wherein the separation between the free layer and the bias magnet is less than about 5 nanometers.

13. A disk drive, comprising:
a magnetic disk;
a write element for writing information to said disk;
a magnetoresistive sensor for reading information from said disk, wherein said magnetoresistive sensor includes:
a sensor stack including a ferromagnetic pinned layer and a ferromagnetic free layer, said sensor stack having a first and second end;
a first bias magnet disposed at said first end of said sensor stack, said first bias magnet having a substantially vertical end wall; and,
a second bias magnet disposed at said second end of said sensor stack, said second bias magnet having a substantially vertical end wall;
wherein the free layer includes a geometrical center, each bias magnet includes a geometrical center, wherein the geometrical centers of the bias magnets are offset from the geometrical center of the free layer,
wherein the separation between the free layer and the bias magnet is less than about 5 nanometers.

14. A disk drive, comprising:
a magnetic disk;
a write element for writing information to said disk;
a magnetoresistive sensor for reading information from said disk, wherein said magnetoresistive sensor includes:
a sensor stack including a ferromagnetic free layer, said ferromagnetic free layer having a first and second end;
a nonmagnetic spacer layer disposed at said first end of said sensor stack, said nonmagnetic spacer layer having a thickness;
a bias magnet disposed over said nonmagnetic spacer layer at said first end of said ferromagnetic free layer, wherein said bias magnet includes a substantially vertical end wall and provides a magnetic stabilization field affecting said free layer, said magnetic stabilization field having a magnitude;
wherein said thickness of said nonmagnetic spacer layer is adjusted such that said magnitude of said magnetic stabilization field is within a preselected range of values;
wherein the free layer includes a geometrical center, each bias magnet includes a geometrical center, wherein the geometrical centers of the bias magnets are offset from the geometrical center of the free layer
wherein the separation between the free layer and the bias magnet is less than about 5 nanometers.

* * * * *